(12) United States Patent
Muehlbacher et al.

(10) Patent No.: US 9,653,434 B2
(45) Date of Patent: May 16, 2017

(54) LED MODULE

(71) Applicant: TRIDONIC GMBH & CO KG, Dornbirn (AT)

(72) Inventors: Gerd Muehlbacher, Hohenems (AT); Stefan Kerber, Bregenz (AT); Gavin Brydon, Gateshead (GB)

(73) Assignee: TRIDONIC GMBH & CO KG, Dornbirn (AT)

( * ) Notice: Subject to any disclaimer, the term of this patent is extended or adjusted under 35 U.S.C. 154(b) by 0 days.

(21) Appl. No.: 14/358,332

(22) PCT Filed: Nov. 15, 2012

(86) PCT No.: PCT/EP2012/072704
§ 371 (c)(1),
(2) Date: May 15, 2014

(87) PCT Pub. No.: WO2013/072407
PCT Pub. Date: May 23, 2013

(65) Prior Publication Data
US 2014/0264406 A1    Sep. 18, 2014

(30) Foreign Application Priority Data

Nov. 15, 2011  (DE) .......... 10 2011 086 359

(51) Int. Cl.
| H01L 33/00 | (2010.01) |
| H01L 25/075 | (2006.01) |
| H01L 33/50 | (2010.01) |
| H01L 33/64 | (2010.01) |
| H01L 33/58 | (2010.01) |

(52) U.S. Cl.
CPC .......... *H01L 25/0753* (2013.01); *H01L 33/50* (2013.01); *H01L 33/58* (2013.01); *H01L 33/64* (2013.01); *H01L 33/644* (2013.01); *H01L 2224/48091* (2013.01); *H01L 2224/48137* (2013.01)

(58) Field of Classification Search
CPC ....... H01L 33/38; H01L 33/005; H01L 33/60; H01L 33/0079; H01L 33/405; H01L 33/46; H01L 33/56
USPC .......... 257/98, 99, 100, 89, 88, 79
See application file for complete search history.

(56) References Cited

U.S. PATENT DOCUMENTS 8,440,500 B2 * 5/2013 Su ...................... H01L 25/0753
438/116
2004/0211970 A1   10/2004  Hayashimoto et al.
2005/0139846 A1    6/2005  Park et al.
2010/0295070 A1   11/2010  Su et al.

FOREIGN PATENT DOCUMENTS

EP      1487025 A2   12/2004
WO   2006006544 A1    1/2006

* cited by examiner

*Primary Examiner* — Hoa B Trinh
(74) *Attorney, Agent, or Firm* — Volpe and Koenig, P.C.

(57) ABSTRACT

The invention relates to a light-emitting diode arrangement having the following: a preferably heat-conductive substrate (2); a printed circuit board (5) which is arranged on the substrate (2), a recess (9) being provided in the printed circuit board (5); and at least one light-emitting diode chip (3) which is arranged on the substrate (2) and in the recess (9), said recess (9) being at least partly filled with at least one matrix material which preferably has a color-converting material (8).

17 Claims, 3 Drawing Sheets

LED MODULE

FIELD OF THE INVENTION

The present invention relates to light-emitting diode arrangements and in particular the field of so-called white light-emitting diodes or LEDs.

BACKGROUND

It is known from the prior art to convert the light e.g. of blue LEDs into white mixed light by means of color conversion, wherein a phosphor absorbs the light emitted by the light-emitting diode chip and converts it into light having a longer wavelength. From a blue light generated by an LED chip, if appropriate in combination with a further (for example red) LED chip, white light can thus be generated.

A light-emitting diode arrangement 60 shown in FIG. 6 is already known from the prior art, in which light-emitting diode arrangement a light-emitting diode chip 61 is arranged on a base 62 comprising an insulation layer 63 and an electrically conductive layer having conductor tracks 64. The chip 61 is situated on one conductor track and is additionally connected to a further conductor track by means of a bonding wire 65. A wall 66 is provided around the chip 61. In accordance with the so-called "dam and fill" technique, the inner region defined by said wall is filled with a color conversion material 67, wherein the light-emitting diode chip 61 is surrounded by said material.

What is disadvantageous about this configuration, however, is the heat dissipation proceeding from the light-emitting diode chip 61. Air or gas is actually situated in the light emission direction and around the walls. Although the chip on its underside is in direct contact with a thermally conductive conductor track, the latter is hardly suitable for transferring heat on account of its size. An insulation layer 63 is provided in the lower region of the light-emitting diode arrangement 60, said insulation layer impairing a possible dissipation of heat.

For better regulation of the temperature within the light-emitting diode arrangement 60, a further arrangement 70 shown in FIG. 7 is known from the prior art, in which arrangement a coupler plate 71 several millimeters thick is used as a heat sink, said coupler plate being coated highly reflectively in the light emission direction at least on the top side. A circular depression is deep-drawn in the center of this heat sink plate, in which depression a plurality of series-connected light-emitting diode chips 72 are adhesively bonded. Afterward, the depression was potted virtually flush with the color conversion medium 73, e.g. phosphor.

This configuration has the advantage that the heat transfer from the light-emitting diode chips 72 to the heat sink is virtually optimal. However, there is the problem that this configuration does not satisfy requirements in respect of the dielectric strength. In the case of the known design, therefore, an undesired voltage breakdown can disadvantageously occur.

Accordingly, the present invention is based on the object of specifying a possibility for realizing a light-emitting diode arrangement in which a good compromise between heat dissipation and voltage endurance is ensured. In particular, a good temperature regulation or heat dissipation and a high dielectric strength are intended to be achievable.

SUMMARY

The object is achieved according to the invention by means of the features of claim 1. The dependent claims relate to advantageous developments of the invention.

It is proposed to form a lateral boundary for the color conversion medium, which boundary is produced e.g. by an additional wall or by the edge of the deep-drawn region of the plate in the case of the prior art, by the wall of a cutout of a printed circuit board (PCB), which is preferably applied to a metallic heat sink. The printed circuit board can have one or a plurality of these cutouts, wherein one or a plurality of LED chips is/are arranged in all or some of said cutouts. Into said cutout, therefore, one or a plurality of LED dies can be applied, e.g. adhesively bonded, directly onto the bare metallic heat sink underneath.

The LED dies in said cutout are then preferably contact-connected by means of bonding wires on metalized pads arranged on the printed circuit board outside the cutout, but substantially adjoining the latter. By means of said pads, it is then also possible to make electrical contact with the LED dies arranged in the cutout via the connecting wires, which are usually larger.

Afterward, the one or the plurality of cutouts in the printed circuit board is/are potted with e.g. a matrix containing the conversion substance until the cutout is filled preferably substantially flush.

In accordance with a first aspect of the invention, a light-emitting diode arrangement is proposed, comprising:
a preferably thermally conductive carrier,
a printed circuit board arranged on the carrier, wherein a cutout is provided in the printed circuit board,
at least one light-emitting diode chip which is arranged on the carrier and in the cutout,
wherein the cutout is at least partly filled, preferably flush, with matrix material, which can comprise at least one color conversion material.

Preferably, at least one light-emitting diode chip can be covered with the color conversion material. The thickness or the concentration of the color conversion material above the light-emitting diode chip in the emission direction is preferably chosen depending on the desired wavelength shift. The greater the thickness or concentration, the greater the shift in the spectrum of the color-converted light.

Preferably, the inner side of the printed circuit board which delimits the cutout in said printed circuit board can be at least partly covered with the color conversion material.

Preferably, at least two light-emitting diode chips of the light-emitting diode arrangement can have different emission spectra.

Exclusively light-emitting diode chips which have substantially an identical emission spectrum can be arranged in each cutout.

Preferably, the printed circuit board can comprise at least two cutouts, wherein the thickness of the color conversion material can be individually adapted in each cutout. Said thickness can be chosen such that the shift in the spectrum of the color-converted light is chosen individually for each cutout. What can thereby be achieved, for example, is that the respective light-emitting diode chips within a cutout emit light substantially in the same wavelength range.

Similarly, the composition and/or the concentration of the color conversion material can also be individually adapted in each cutout.

The mixed light resulting from the mixing of the light generated by each light-emitting diode chip with phosphor conversion can be in particular a white light.

The light-emitting diode chip can be fixed on the carrier by means of a chip adhesive or by means of soldering.

At least in the region of the cutout, the carrier can be coated reflectively or highly reflectively in the light emission direction.

The inner side of the perpendicular boundary wall of the cutout of the printed circuit board can also be coated reflectively or highly reflectively.

The inner side of the printed circuit board which delimits the cutout can be configured such that it widens in a funnel-shaped fashion in the light emission direction. Alternatively, the area of the cutout on the top side of the printed circuit board can be larger than the area of the cutout on the underside of the printed circuit board.

Preferably, a reflector which is preferably reflective and preferably funnel-shaped in the light emission direction can be arranged within the cutout and in a manner laterally surrounding the at least one LED chip.

A wall projecting above the plane of the printed circuit board upward (in the light emission direction) can be provided on the printed circuit board and around the cutout in such a way that the color conversion material can be filled in the cutout partly or completely as far as the upper edge of the wall. By virtue of this additional "dam-and-fill" technique, the thickness of the applied color conversion material above the light-emitting diode chips overall can also be increased, and in a manner independently of the thickness of the printed circuit board.

As an alternative or in addition thereto, the carrier on which the at least one LED chip is arranged can have a depression in the region of the cutout, at least one light-emitting diode chip being arranged in said depression. This measure likewise makes it possible to increase the thickness of the color conversion material used for color conversion above the light-emitting diode chips in the light emission direction.

Preferably, an optical unit can be arranged on the color conversion material in order, for example, to concentrate the light generated by the light-emitting diode chips.

In accordance with a further aspect of the invention, a luminaire is proposed, in particular a retrofit lamp, comprising a light-emitting diode arrangement defined above.

In accordance with yet another aspect of the invention, a method for producing a light-emitting diode arrangement is proposed, comprising:

providing a preferably thermally conductive carrier, fitting a printed circuit board and at least one light-emitting diode chip onto the carrier, wherein a cutout is provided in the printed circuit board and at least one light-emitting diode chip is arranged in the cutout, filling the cutout at least partly with a color conversion material.

BRIEF DESCRIPTION OF THE DRAWINGS

The invention will be explained in greater detail below with reference to the accompanying drawings, in which.

DETAILED DESCRIPTION OF THE PREFERRED EMBODIMENTS

Figure 1:
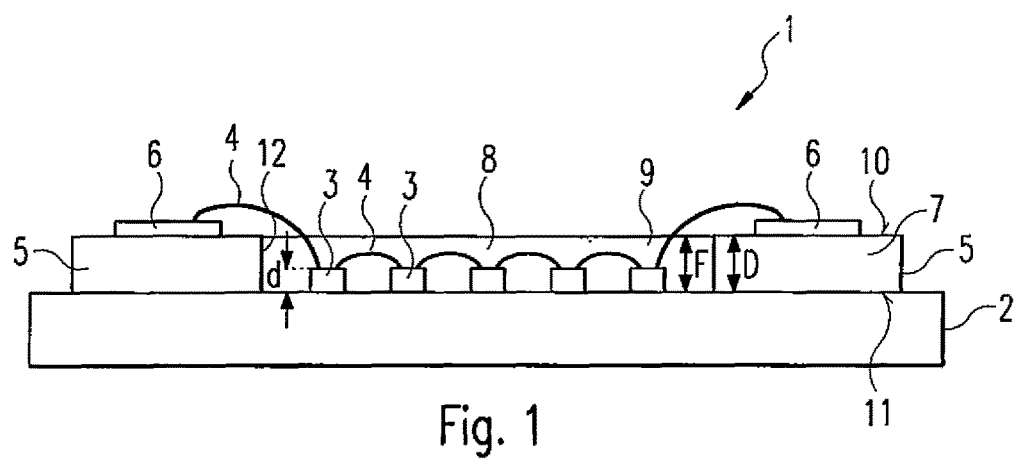
FIG. 1 shows one embodiment according to the invention of a light-emitting diode arrangement in a side view.

The light-emitting diode arrangement which is illustrated in FIG. 1 and provided with the reference sign 1, and which can be part of an LED lamp, in particular of a retrofit LED lamp, comprises a carrier 2, which is preferably formed from metal, e.g. aluminum. The carrier 2 is embodied as a heat sink and has a good thermal conductivity compared with the other elements of the arrangement and serves, inter alia, to dissipate heat generated during the operation of the light-emitting diode arrangement 1. The thermal conductivity of the carrier 2 is in particular higher than that of gaseous substances or of plastics materials.

The light-emitting diode arrangement 1 illustrated comprises a plurality of light-emitting diode chips 3 ("dies"). The number of light-emitting diode chips 3 can vary. The number of light-emitting diode chips 3 can be chosen e.g. such that the light-emitting diode arrangement 1 overall comprises for example a small number of high-power LEDs. Alternatively, a comparable brightness is achievable with an overall larger number of low-power LEDs. OLEDs can also be used besides LEDs. Alternative arrangements can also comprise a single light-emitting diode chip 3. The number of chips, the number of LEDs per chip and the power of the individual chips are adaptable: these parameters depend e.g. on the desired maximum brightness or maximum power of the light-emitting diode arrangement 1.

The light-emitting diode chips 3 are arranged on the carrier and are preferably electrically insulated from the metallic carrier. During operation, this arrangement is advantageous insofar as the heat generated by the chips is dissipated via the carrier 2. This arrangement enables an effective dissipation of heat from the light-emitting diode chips 3. The chips 3 are fixed on the carrier 2 for example with the aid of an adhesive having relatively good thermal conductivity. Preferably, a thermally conductive adhesive is then used in order not to impair or limit the transfer of heat between the chips and the carrier 2. Alternatively, the chips can be fixed on the carrier by means of soldering.

Furthermore, a printed circuit board 5 or circuit board or PCB is arranged on the carrier. The printed circuit board 5 consists of an electrically insulating material 7 with conductive conductor tracks and, if appropriate, metallization areas ("pads") 6 fitted thereon. The printed circuit board 5 and in particular the conductor tracks 6 serve for electrically connecting the chips 3 to an operating circuit, which is shown e.g. in FIG. 3 by the reference sign 32 and can be accommodated in the housing of the LED lamp.

The electrical contact-connection of a chip 3 is effected e.g. by means of so-called bonding wires 4 that lead from pads on the printed circuit board to electrodes on the top side of the light-emitting diode chip 3. The electrical connection between an electrically conductive conductor track 6 and a chip 3 is effected via such a bonding wire 4. Bonding wires are likewise provided between the different chips 3. Overall, the light-emitting diode chips 3 in an arrangement are preferably connected in series between two conductor tracks 6. Alternatively, it is also possible to provide a plurality of series circuits comprising light-emitting diode chips 3 in a light-emitting diode arrangement 1, where said series circuits are in turn interconnected in parallel with one another between the two conductor tracks 6.

Above the light-emitting diode chips 3 there is at least one color conversion material 8. This material 8 converts at least part of the (e.g. blue) light emitted by a light-emitting diode chip 3 into light having a different wavelength (e.g. green-yellow, yellow or orange). The resulting mixed light is preferably white.

In this case, a phosphor or a luminescent substance, which is usually embedded into a matrix, is dispensed over the at least one LED chip within the cutout. The blue light is then absorbed by the phosphors in the vicinity of the light-emitting diode chip 3 and is subsequently converted into light having a longer wavelength. This longer-wavelength light of the phosphors in combination with the unconverted blue light of the light-emitting diode chip then results in a white mixed light.

Furthermore, in the depression formed by the cutout, it is also possible to arrange further, e.g. red, LEDs, the light of which is not converted into a different spectrum by the color conversion material, but the light of which modifies e.g. the color rendering and/or the color temperature of the white mixed light.

However, the invention also relates to embodiments wherein a matrix material e.g. for encapsulation purposes without dispersed conversion material is dispensed over at least one LED chip in a cutout in a printed circuit board. The matrix material, e.g. silicone, thus protects e.g. the LED chip and/or the bonding wires mechanically or against moisture. This technique is also suitable for LED lamps in which RGB (red, green, blue) chips are provided, the light of which is scattered by the matrix material. However, alternatively or additionally it is also possible for color conversion material to be present at a distance from the LED chips, e.g. in an optical unit.

In order that the light emitted by the light-emitting diode chips 3 is subjected to color conversion, a cutout or opening 9 is then provided in the printed circuit board 5, said cutout or opening being configured as a perforation from the top side 10 of the printed circuit board 5 toward the underside 11 of the printed circuit board. The cutout 9 is delimited perpendicularly to the emission direction by an inner side 12 of the printed circuit board. This inner side 12 is defined by the cutout in the printed circuit board. The light-emitting diode chips 3 are arranged in said cutout 9. According to the invention, it is also possible for a plurality of cutouts 9 to be provided, wherein in each case at least one chip 3 can be arranged in each cutout.

The arrangement 1 can comprise one or a plurality of LEDs and/or OLEDs. In this case, it is possible to use in particular phosphor-converted blue LEDs, RGB LED chips or combinations thereof. The phosphor-converted LEDs can be in particular at least one blue LED wherein part of the emitted blue light is converted into yellow, greenish yellow light by a color conversion medium such as phosphor. The use of phosphor-converted green and/or greenish white LEDs is also conceivable. Preferably, use is also additionally made of one or a plurality of red LEDs or other monochromatic LEDs which lead to a higher color rendering index and provide for a warmer light. In this case, the red LEDs can be arranged separately from the phosphor-converted blue LEDs, or they can be situated alongside the latter, such that part of their emitted red light is likewise phosphor-converted.

As is evident from FIG. 1, the thickness (depth) D of the printed circuit board 5 is preferably greater, more preferably more than two or three times greater, than the thickness d of a chip 3:

$$D > d.$$

Accordingly, the cutout 9 can be filled by a color conversion material 8 in such a way that the sides and the top side of the chips 3 are covered. Preferably, the quantity of color conversion material 8, i.e. the thickness F of the color conversion material 8, in the light-emitting diode arrangement 1 is chosen such that the bonding wires 4 for connecting the chips 3 within a cutout are also covered by the color conversion material 8.

Preferably, the cutout 9 in the printed circuit board 5 is completely filled with the color conversion material 8. This has the result that e.g. the phosphor or luminescent substance is potted flush or virtually flush, and that the height F of the color conversion material 8 filled in corresponds to the thickness D of the printed circuit board 5:

$$F = D.$$

The effect of the shift in the wavelength of the generated light is the greatest in the case of such complete filling of the cutout 9.

The height F of the color conversion material 8 can also substantially correspond to the thickness D of the printed circuit board 5:

$$(D-F)/D < 10\%$$

or preferably $(D-F)/D < 5\%$ or preferably $(D-F)/D < 1\%$.

The surface of the color conversion material 8 is preferably flat or at least substantially flat, i.e. parallel to the carrier 2 and to the printed circuit board 5 or to the top side 10 of the printed circuit board. It can thus be ensured that the color conversion material 8 covers the surface of the light-emitting diode chips 3 on all sides and uniformly with a constant thickness. This in turn has the advantage that the light which emerges from the color conversion material 8 surrounded the LED chips is homogeneous. A homogeneous color thus arises at the surface of the phosphor layer.

Alternatively, the surface of the color conversion material 8 can also be curved upward in a meniscus-shaped fashion.

The light rays leaving the color conversion material 8 can subsequently in turn be concentrated by a lens (not shown). Said lens is preferably fitted directly on the color conversion material 8 and preferably not on the conductor tracks 6.

Figure 4:
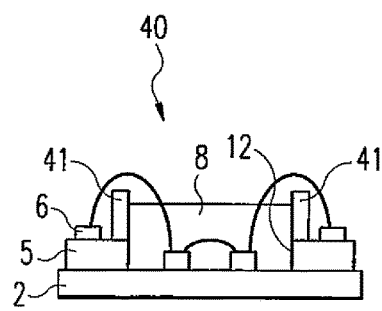
FIG. 4 shows a further embodiment of the light-emitting diode arrangement according to the invention.
Figure 5:
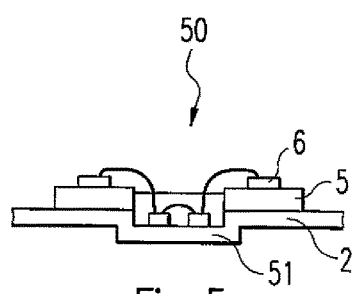
FIG. 5 shows yet another embodiment of the light-emitting diode arrangement according to the invention.
Figure 6:
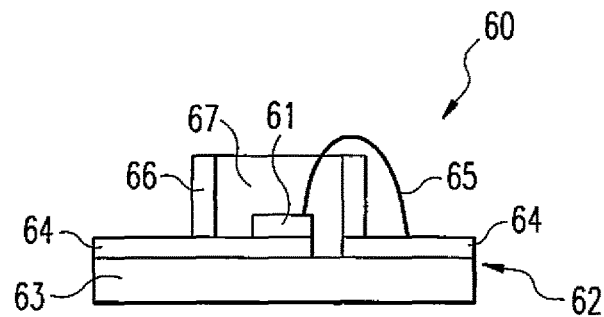
FIGS. 6-7 show light-emitting diode arrangements in accordance with the prior art.
Figure 7:
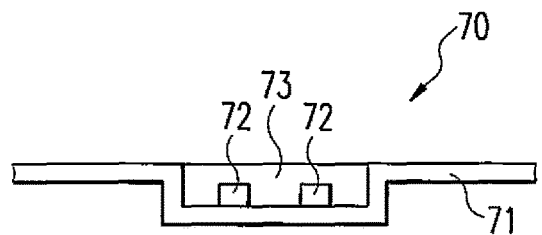

FIGS. 4 and 5 show further embodiments which make it possible, for example, to amplify the shift in the wavelengths of the generated light. This is achieved by the thickness of the color conversion material 8 above the light-emitting diode chips 3 being increased in relation to the light emission direction.

In the arrangement 40 in accordance with FIG. 4, the height of the color conversion material layer is increased in such a way that a wall 41 is arranged on the printed circuit board and around the cutout 9. The color conversion material 8 can then be filled as far as the termination of said wall 41.

In the embodiment of the light-emitting diode arrangement 50 which is shown in FIG. 5, however, a depression is provided in the carrier 2, which depression can be brought about e.g. by the deep-drawing of a carrier shaped as sheet metal. If the chips 3 are then arranged in the depression 51 of the carrier and the printed circuit board 5 is outside this depression, the thickness of the color conversion material 8 above the chips can likewise be increased, and the wavelength of the generated light can accordingly be shifted further. The embodiments in accordance with FIGS. 4 and 5 can be combined in order additionally to amplify the color conversion effect without, however, reducing the thermal conductivity of the illuminant arrangement.

Figure 2:
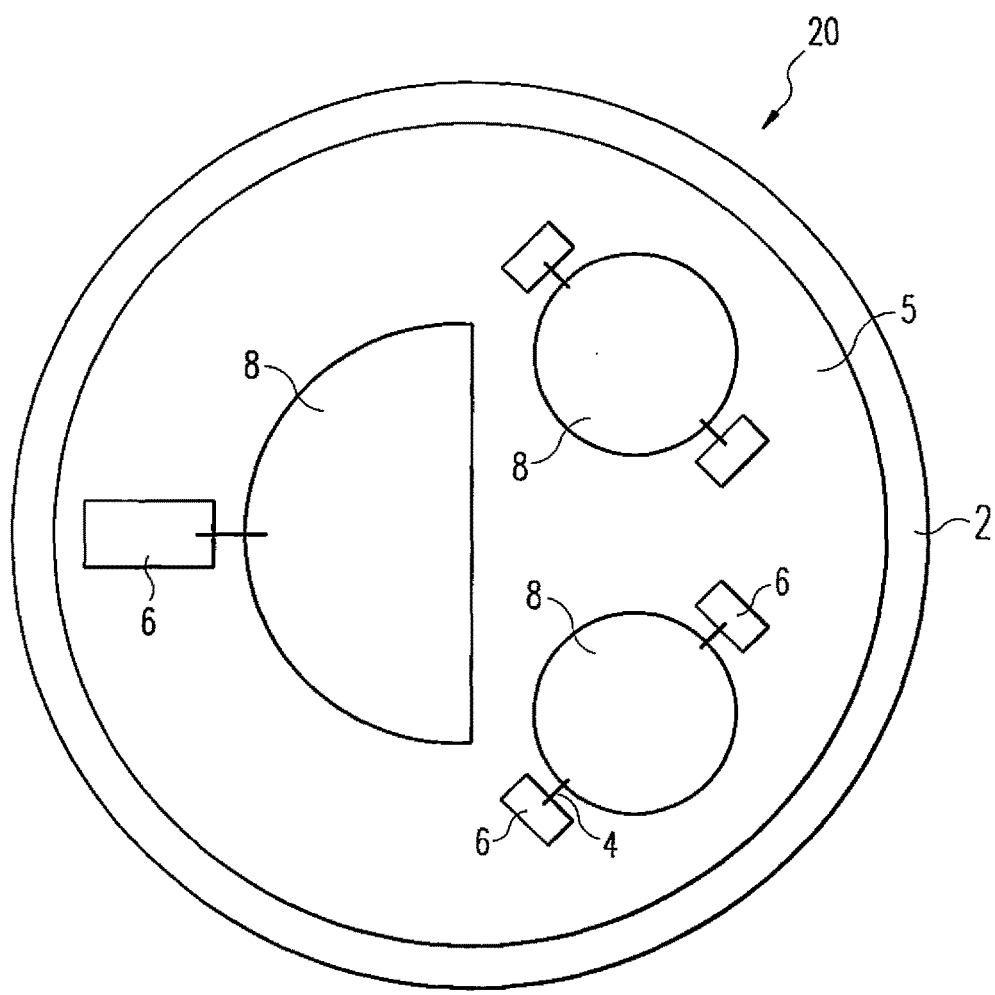
FIG. 2 shows one embodiment according to the invention of a light-emitting diode arrangement in a plan view.

FIG. 2 shows a plan view of one embodiment according to the invention of a light-emitting diode arrangement 20. The carrier 2 is embodied in a circular fashion, such that it can be used in a retrofit lamp. The printed circuit board 5 having a plurality of cutouts and conductor tracks 6 are situated on the carrier. The cutouts are in each case filled with color conversion material 8. Bonding wires 4 lead from the conductor tracks 6 in the form of pads to the light-emitting diode chips (not shown). Further, preferably thicker wires (not shown) in each case lead from the conductor tracks 6 to a power supply for the LEDs.

Figure 3:
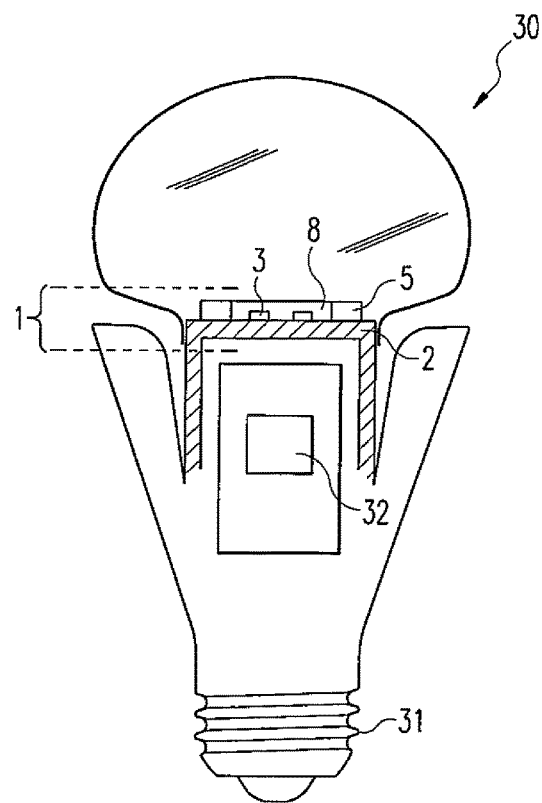
FIG. 3 shows an illustration of one embodiment according to the invention of a light-emitting diode arrangement in the form of a retrofit lamp partly in a longitudinal section.

FIG. 3 shows one embodiment according to the invention of a light-emitting diode lamp 30 comprising a light-emitting diode arrangement according to the invention, in particular comprising the light-emitting diode arrangement 1.

FIG. 3 illustrates a so-called retrofit light-emitting diode lamp 30 for use in a conventional lampholder. In this case, the LED lamp has the form and function e.g. of a conventional incandescent bulb or halogen lamp, but it comprises one or a plurality of LED chips 3 as illuminant. For this purpose, the light-emitting diode lamp 30, preferably configured in the form of a bulb, has a conventional base 31, for example having an E14, E17 or E27 screw thread. Alternatively, a base designed for a low-voltage connection is also conceivable, such as a G4, G5 or G6 pin base. A BA9 or BA15 bayonet base is also conceivable.

If the light-emitting diode lamp 30 is supplied with AC system voltage or with low voltage by means of a corresponding lampholder, current matching is required for the correct operation of the light-emitting diode arrangement 1. For this purpose, the lamp 30 comprises a driver circuit 32. The latter can comprise any control circuit that is conceivable for this use and such as is known from the prior art. In this regard, by way of example, an AC-DC converter for rectifying an AC system voltage is conceivable. Advantageously, there can be connected downstream thereof a DC-DC converter or other converter which reduces the voltage or the current or the power. In this case, a switch which is switched by means of pulse width modulation (PWM) can be used. A current limiting circuit connected downstream, for example by means of a transistor circuit, is also conceivable.

Figure 8:
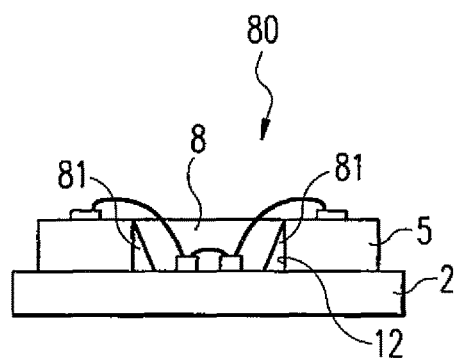
FIG. 8 shows a further embodiment of the light-emitting diode arrangement according to the invention.

The inner side 12 of the printed circuit board is preferably configured as reflective or highly reflective. This is achieved by applying a thin layer of reflective material. Preferably, said inner side is configured in a funnel-shaped fashion, such that the light generated by the light-emitting diode chips 3 is reflected as far as possible perpendicularly to the carrier 2. Alternatively, FIG. 8 shows that a reflector 81 is arranged on the inner side 12 in order to reflect the generated light out of the cutout. Preferably, the reflector 81 can be funnel-shaped in the light emission direction. This is advantageous because then the inner side 12 of the printed circuit board 5 can be configured perpendicularly to the surface of the printed circuit board. This in turn has the advantage that the cutout 9 can be realized more simply, e.g. by drilling.

REFERENCE SIGNS

1 Light-emitting diode arrangement
2 Carrier
3 Light-emitting diode chip (or light-emitting diode die)
4 Bonding wire
5 Printed circuit board (or circuit board or PCB)
6 Conductor track (or pads)
7 Electrically insulating material
8 Color conversion material
9 Cutout in the printed circuit board 5
10 Top side of the printed circuit board 5
11 Underside of the printed circuit board 5
12 Inner side of the printed circuit board 5
20 Light-emitting diode arrangement
30 Light-emitting diode lamp
31 Base
32 Driver circuit
40 Light-emitting diode arrangement
41 Wall
50 Light-emitting diode arrangement
51 Depression
60 Light-emitting diode arrangement
61 Light-emitting diode chip
62 Base
63 Insulation layer
64 Conductor track
65 Bonding wire
66 Wall
67 Color conversion medium
70 Light-emitting diode arrangement
71 Copper plate
72 Light-emitting diode chip
73 Color conversion medium
80 Light-emitting diode arrangement
81 Reflector

The invention claimed is:
1. A light-emitting diode (LED) arrangement, comprising:
a metallic, thermally conductive carrier (2),
a printed circuit board (5) arranged on the carrier (2), wherein a cutout (9) is provided in the printed circuit board (5),
at least one light-emitting diode chip (3) which is arranged on the carrier (2) and in the cutout (9) and is electrically contact-connected to the printed circuit board, wherein the printed circuit board (5) has a thickness (D) that is 2 to 3 times greater than a thickness of the light-emitting diode chip (3), and wherein the cutout (9) is completely filled with at least one matrix material comprising a color conversion material (8), a height (F) of the filled in color conversion material (8) corresponds to the thickness (D) of the printed circuit board (5).

2. The light-emitting diode arrangement as claimed in claim 1, wherein an inner side (12) of the printed circuit board (5) which delimits the cutout (9) in said printed circuit board (5) is at least partly covered with the color conversion material (8).

3. The light-emitting diode arrangement as claimed in claim 1, wherein the light-emitting diode arrangement comprises at least two light-emitting diode chips (3) which have different emission spectra, wherein said two LED chips are arranged in the same cutout or in different cutouts in the printed circuit board.

4. The light-emitting diode arrangement as claimed in claim 1, wherein only light-emitting diode chips (3) which have a substantially identical emission spectrum are arranged in each cutout (9).

5. The light-emitting diode arrangement as claimed in claim 1, wherein the printed circuit board (5) comprises at least two cutouts (9), wherein a thickness of the color conversion material (8) is individually adapted in each cutout (9).

6. The light-emitting diode arrangement as claimed in claim 1, wherein the at least one of composition or the concentration of the color conversion material (8) is individually adapted in each cutout.

7. The light-emitting diode arrangement as claimed in claim 1, wherein the mixed light resulting from the mixing of the light generated by each light-emitting diode chip (3) with phosphor conversion is a white light.

8. The light-emitting diode arrangement as claimed in claim 1, wherein the light-emitting diode chip (3) is fixed on the carrier (2) by means of a chip adhesive or soldering.

9. The light-emitting diode arrangement as claimed in claim 1, wherein, at least in the region of the cutout (9), the carrier (2) is coated reflectively or highly reflectively in the light emission direction.

10. The light-emitting diode arrangement as claimed in claim 1, wherein an inner side (12) of the printed circuit board (5) which delimits the cutout (9) is coated reflectively or highly reflectively.

11. The light-emitting diode arrangement as claimed in claim 1, wherein an inner side (12) of the printed circuit board (5) which delimits the cutout (9) is configured in a funnel-shaped fashion as viewed in the light emission direction, or wherein an area of the cutout (9) on a top side (10) of the printed circuit board (5) is greater than an area of the cutout (9) on an underside (11) of the printed circuit board (5).

12. The light-emitting diode arrangement as claimed in claim 1, wherein a reflector (81), which is reflective and funnel-shaped in the light emission direction, is arranged on an inner side (12) of the printed circuit board (5) which defines the cutout (9).

13. The light-emitting diode arrangement as claimed in claim 1, wherein a wall (41) is provided on the printed circuit board around the cutout in such a way that the color conversion material (8) can be filled in the cutout as far as the wall (41).

14. The light-emitting diode arrangement as claimed in claim 1, wherein the carrier (2) has a depression (51) in a region of the cutout (9), the light-emitting diode chips (3) being arranged on said depression.

15. The light-emitting diode arrangement as claimed in claim 1, wherein a lens is arranged on the color conversion material (8).

16. An LED lamp, comprising a light-emitting diode arrangement as claimed in claim 1.

17. A light-emitting diode (LED) arrangement, comprising:
a metallic, thermally conductive carrier (2),
a printed circuit board (5) arranged on the carrier (2), wherein a cutout (9) is provided in the printed circuit board (5),
at least one light-emitting diode chip (3), which is arranged on the carrier (2) and in the cutout (9) and is electrically contact-connected, by a bonding wire (4), to a conductor track (6) of the printed circuit board, wherein the printed circuit board (5) has a thickness (D) that is 2 to 3 times greater than a thickness of the light-emitting diode chip (3), and wherein the cutout (9) is completely filled with at least one matrix material comprising a color conversion material (8) a height (F) of the filled in color conversion material (8) corresponds to the thickness (D) of the printed circuit board (5).

* * * * *